United States Patent [19]

Forster et al.

[11] Patent Number: 5,284,792
[45] Date of Patent: Feb. 8, 1994

[54] FULL-WAFER PROCESSING OF LASER DIODES WITH CLEAVED FACETS

[75] Inventors: Theodor Forster, Thalwil; Christoph Harder, Zurich; Albertus Oosenbrug, Langnau am Albis, all of Switzerland; Gary W. Rubloff, Waccabuc, N.Y.

[73] Assignee: International Business Machines Corporation, Armonk, N.Y.

[21] Appl. No.: 74,530

[22] Filed: Jun. 11, 1993

[30] Foreign Application Priority Data

Sep. 6, 1992 [EP] European Pat. Off. ........ 92810438.9

[51] Int. Cl.$^5$ ............................................. H01L 21/20
[52] U.S. Cl. ................................... 437/129; 437/126; 437/226; 148/DIG. 28
[58] Field of Search ............... 437/129, 130, 126, 226; 148/DIG. 28

[56] References Cited

U.S. PATENT DOCUMENTS

| 4,044,937 | 8/1977 | Hill et al. | |
|---|---|---|---|
| 4,758,532 | 7/1988 | Yagi et al. | 437/129 |
| 4,814,296 | 3/1989 | Jedlicka et al. | 437/226 |
| 4,961,821 | 10/1990 | Drake et al. | 437/226 |
| 5,024,970 | 6/1991 | Mori | 148/DIG. 28 |
| 5,047,364 | 9/1991 | Hattori | 437/129 |
| 5,128,282 | 7/1992 | Ormond et al. | 437/226 |
| 5,196,378 | 3/1993 | Bean et al. | 148/DIG. 28 |

FOREIGN PATENT DOCUMENTS

| 3-286553 | 12/1991 | Japan | 437/226 |
|---|---|---|---|
| 4-10554 | 1/1992 | Japan | 437/226 |
| 0363548 | 10/1988 | Switzerland . | |
| 0457998 | 5/1990 | Switzerland . | |

OTHER PUBLICATIONS

H. Blauvelt et al., "AlGaAs Lasers with Micro-Cleaved Mirrors Suitable for Monolithic Integration", Applied Physics Letters, vol. 0, No. 4, Feb. 1989, pp. 289-290.

K. Hikosaka et al., "Selective Dry Etching of AlGaAs-GaAs Heterojunction", Japanese Journal of Applied Physics, vol. 20, No. 11, Nov. 1981, pp. L847-L850.

K. L. Seaward et al., "An Analytical Study of Etch-Stop Reactions for GaAs on AlGaAs in $CCl_2F_2$ Plasma", Journal of Applied Physics, vol. 61, No. 6, Mar. 1987, pp. 2358-2364.

*Primary Examiner*—Tom Thomas
*Assistant Examiner*—Kevin M. Picardat

[57] ABSTRACT

A method for full-wafer processing of laser diodes with cleaved facets combining the advantages of full-wafer processing, to date known from processing lasers with etched facets, with the advantages of cleaved facets. The steps being: defining the position of the facets to be cleaved by scribing marks into the top surface of a laser structure comprising epitaxially grown layers, these scribed marks being perpendicular to the optical axis of the lasers to be made, the scribed marks being parallel, their distance ($l_c$) defining the length of the laser cavities and the distance ($l_b$) between the facets of neighboring laser diodes; and covering the uppermost portion with an etch mask pattern which provides for etch windows between the scribed marks defining the position of facets of neighboring lasers; and etching trenches into an upper portion of the structure defined by the etch windows; and partly underetching the upper portion during a second etch step such that the laser facets can be defined by cleaving the upper portion along the scribed marks without cleaving the whole laser structure; and ultrasonically or mechanically cleaving the upper portions being underetched along the scribed marks; and separating the laser diodes by cleaving them between neighboring lasers.

21 Claims, 7 Drawing Sheets

FULL-WAFER PROCESSING OF LASER DIODES WITH CLEAVED FACETS

TECHNICAL FIELD

The invention concerns a method for full-wafer (FUWA) processing of laser diodes having cleaved mirror facets. According to the inventive method, which is applicable to different compound semiconductors, multiple laser diodes are made on the same wafer, their mirror facets being defined by full-wafer cleaving of underetched portions of the lasers. This method allows full-wafer treatment of the cleaved facets and full-wafer testing of the lasers prior to separating them into individual laser chips.

BACKGROUND OF THE INVENTION

Semiconductor laser diodes have found applications in a wide variety of information handling systems because of their compact size and because their technology is compatible with that of the associated electronic circuitry. They are being employed in areas such as data communications optical storage and optical printing. Most commonly used are group III/V compound materials. Particularly AlGaAs lasers have found extensive usage.

Historically, the mirror facets which define the length of the laser's cavity have been obtained by cleaving the laser bars, i.e., layered structures comprising the active waveguide of the device. Cleaving usually provides single often high quality devices which require, however, further individual processing, such as mirror passivation, and testing. Due to these additional processing steps for each individual laser diode their fabrication and testing costs are unreasonably increased.

More recently, there is a strong trend to increase the scale of integration which requires the replacement of at least one cleaved mirror facet of the laser diodes by an etched mirror. Since substantial progress has been made in obtaining good quality etched mirrors, this technology appears to be very promising. It allows processes like mirror coating and testing to be performed on the full-wafer level, with the benefit of reduced handling, increased yield, and decreased fabrication and testing costs. In addition, etching laser mirrors allows for the monolithic integration of various other devices on the same substrate.

A technique has been reported on in the article "AlGaAs Lasers with Micro-Cleaved Mirrors Suitable for Monolithic Integration", H. Blauvelt et al., Applied Physics Letters, Vol. 40, No. 4, February 1989, pp. 289–290, for cleaving the mirrors of AlGaAs lasers without cleaving the laser's substrate. Such a microcleaved laser diode allows the monolithic integration of other electronic devices on the same substrate. A laser diode with microcleaved facet is described being separated from the GaAs substrate by an intermediate AlGaAs layer with high aluminum content. The thermal resistance of the structure is increased due to this AlGaAs layer with high Al content and the growth of epitaxial layers on top of this layer is made more difficult. Before cleaving the facet, the epitaxially grown layers of the laser are underetched by selectively etching the AlGaAs intermediate layer. This etch step provides for a cantilever structure which can be cleaved. The position of the micro-cleaved facet is defined by the end of the etch groove under the cantilever. A main drawback of this technique is that the length of the cantilever, and therewith the position of the facet to be cleaved, strongly depends on the concentration of the etchant and the etch time. Caused by this fact, the length of the laser's cavity, determined by the position of the facets, cannot be precisely defined.

SUMMARY OF THE INVENTION

The main object of this invention is to provide a method for the full-wafer processing of laser diodes which combines the advantages of full-wafer processing, known from the full-wafer fabrication of lasers with etched mirrors, with the advantages of cleaved facets.

Another object of this invention is to provide a method for making laser diodes with cleaved facets for monolithic integration.

This has been accomplished by full wafer processing of laser diodes, the mirror facets being cleaved without cleaving the laser substrate, or a carrier substrate on which the laser is mounted. Different methods are given providing for underetched structures which can be cleaved along scribed marks. The positions of these scribed marks precisely define the length of the laser's cavity. The inventive method allows for full-wafer treating of the cleaved facets and full-wafer testing prior to separating the individual laser chips.

BRIEF DESCRIPTION OF THE DRAWINGS

The invention is described in detail below with reference to the following drawings which are schematic and not drawn to scale, while more particularly the dimensions of some parts are exaggerated for the sake of clarity.

FIG. 1A illustrates a conventional laser wafer mounted on a carrier substrate;

FIG. 1B illustrates a partially-cut pattern on backside;

FIG. 1C illustrates diamond scribed marks;

FIG. 1D illustrates a patterned etch mask;

FIG. 1E illustrates trench etching;

FIG. 1F illustrates underetching the laser wafer;

FIG. 1G illustrates removal of patterned etch mask;

FIG. 1H illustrates full-wafer mirror cleaving (magnified sketch);

FIG. 1I illustrates full-wafer mirror treatment;

FIG. 1J illustrates laser chip separation.

FIG. 3A illustrates a conventional laser wafer with a partially-cut pattern on backside;

FIG. 3B illustrates diamond scribed marks;

FIG. 3C illustrates a patterned etch mask;

FIG. 3D illustrates trench etching;

FIG. 3E illustrates a magnified sketch showing an optional etch-protection layer;

FIG. 3F illustrates underetching the upper layers.

FIG. 8A illustrates roller cleaving;

FIG. 8B illustrates bar cleaving.

DETAILED DESCRIPTION

Figure 1A:
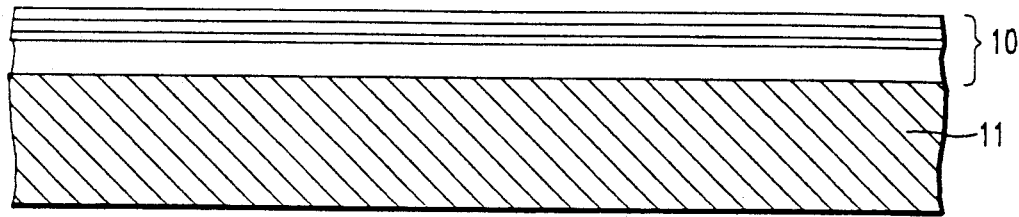
FIGS. 1A–1J are schematic cross-sectional views of processing steps in accordance with the first method.

Three different implementations of the inventive method for the full-wafer processing of laser diodes with cleaved facets are described below. These different implementations of the present invention are based on the following, simplified steps which are described in more detail in connection with the corresponding Figures.

Starting with a conventional laser structure, usually consisting of multiple layers being epitaxially grown on top of a substrate, the size of the laser chips to be made is defined by providing for a partially-cut pattern on the backside of the substrate or on the backside of a carrier substrate on which the laser structure is mounted. The substrate is divided into rectangular areas by the partially-cut pattern, one side thereof being longer than the length of the laser cavity to be made, the other side at least being as long as the width of the laser diode to be made. This partially-cut pattern can be made by cutting it into the backside of the substrate or by scribing it, e.g. using a diamond scriber, into the substrate.

Next, the length of the laser cavities is defined by scribing marks into the surface of the laser structure. The laser facets will be cleaved along these marks. The scribed marks are substantially parallel, the distance therebetween precisely defining the length of the cavities. The partially-cut pattern on the backside has to be aligned with respect to the scribed marks.

A patterned etch mask is formed on top of the laser structure such that rectangular portions thereof cover the lasers to be formed. Illustratively, the etch mask is hard baked resist, platinum or $SiO_2$ and the etching is done in a chlorine-based reactive ion etch (RIE). Etch windows in the mask, which are situated between the facets of neighboring laser diodes, permit the etching of trenches therebetween. These trenches are at least etched through an upper portion of the laser structure. In the following step, this upper portion is underetched to such an extent that the facets of the lasers can be cleaved without cleaving the whole substrate. After this processing step, the etch mask is removed. Next, full-wafer cleaving of the laser facets is carried out. This can be done mechanically, e.g. by directing a force on the underetched, overhanging portions using a bundle of needles. Other alternatives are cleaving by ultrasonic vibrations or using a roller mechanism or other mechanical fixture and thin film studs situated at the very end of the overhanging portions to be cleaved, as explained in context with FIGS. 7 and 8.

The lasers, which are still situated on a common substrate, and which now have cleaved laser facets can be further processed by applying a passivation layer to the facets and/or by full-wafer testing them. This step has to be carried out in a contamination free environment to achieve high quality laser facets.

Finally, the laser diodes are separated by cleaving the substrate along the partially-cut pattern on the backside.

This can be done by feeding the whole wafer through a roller-bar cleaver known in the art. Not all of these steps have to be carried out in the above described order. It is preferable to provide for a well controlled atmosphere, preferably a contamination free environment, during at least some of the processing steps.

The present invention can be adapted to different systems of compound semiconductors such as GaAs, InP and so on. Different kind of lasers such as double-heterostructure lasers or quantum-well lasers with broad contacts, ridge waveguide structures or buried waveguide structures can be processed according to the invention.

Figure 1B:
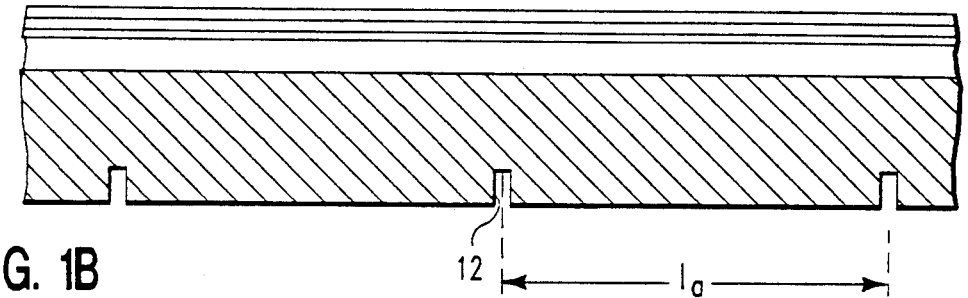
Figure 1C:
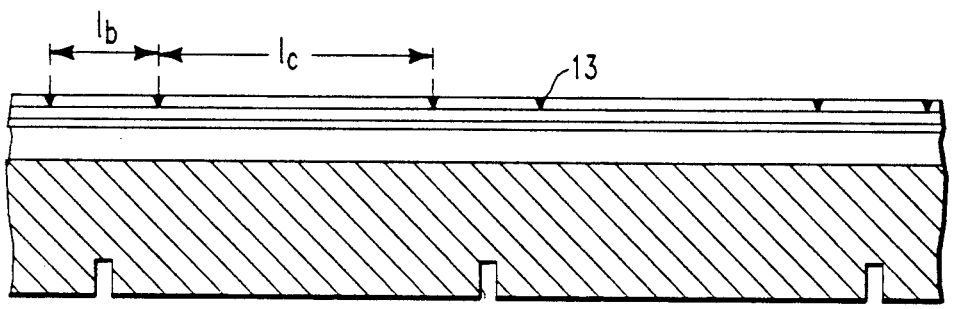

In the following, a first implementation of the inventive method is described, the processing steps being illustrated in FIGS. 1A–1J. Referring to FIG. 2, a top view of a laser chip 21, consisting of a broad contact laser diode 20 mounted on a portion of a carrier substrate, as made by the first implementation of the inventive method, is illustrated. A laser structure 10, consisting of epitaxially grown layers of GaAs situated on top of a GaAs substrate form the starting point for the first implementation of the invention. The layers of structure 10 provide for optical and electric confinement, the light emitting region of the lasers to be made being defined by an active layer. As illustrated in FIG. 1A, this laser structure 10 is mounted on top of a carrier substrate 11. This carrier substrate 11 preferably consists of a material such as silicon, sapphire or diamond. The carrier substrate 11 is suitable for heat sinking the lasers, and should ensure stress-free mounting of the laser structure 10. Efficient cooling of the lasers can be guaranteed by choosing a material of high thermal conductivity, stress-free mounting being obtained providing for thermal expansion match between the carrier substrate 11 on one hand and the laser structure 10 on the other hand. As shown in FIG. 1B, a partially-cut pattern 12 is cut at the backside of the carrier substrate 11. This partially-cut pattern 12 is characterized in that it divides the carrier substrate 11 into rectangular areas. The size $l_a$ of the rectangles being defined by the partially-cut pattern 12 is slightly larger than the size $(l_c \times l_h)$ of the lasers to be made. The depth of the cuts depends on the material of the carrier substrate 12 and its thickness. This step can be carried out at any time or can be omitted, depending on the technique used to separate the laser chips at the end of the whole process.

This laser structure/carrier substrate sandwich is then subjected to the following processing step which provides for a precise definition of the cavity length $l_c$ and the position of the laser facets to be cleaved. To achieve this, diamond scribed marks 13 are scribed on the laser structure 10. These scribed marks 13 must be coarsely aligned to the partially-cut pattern 12 at the backside of the sandwich. This can be achieved using an infrared microscope which permits viewing through the sandwich, because most semiconductors are transparent to infrared light.

Figure 6:
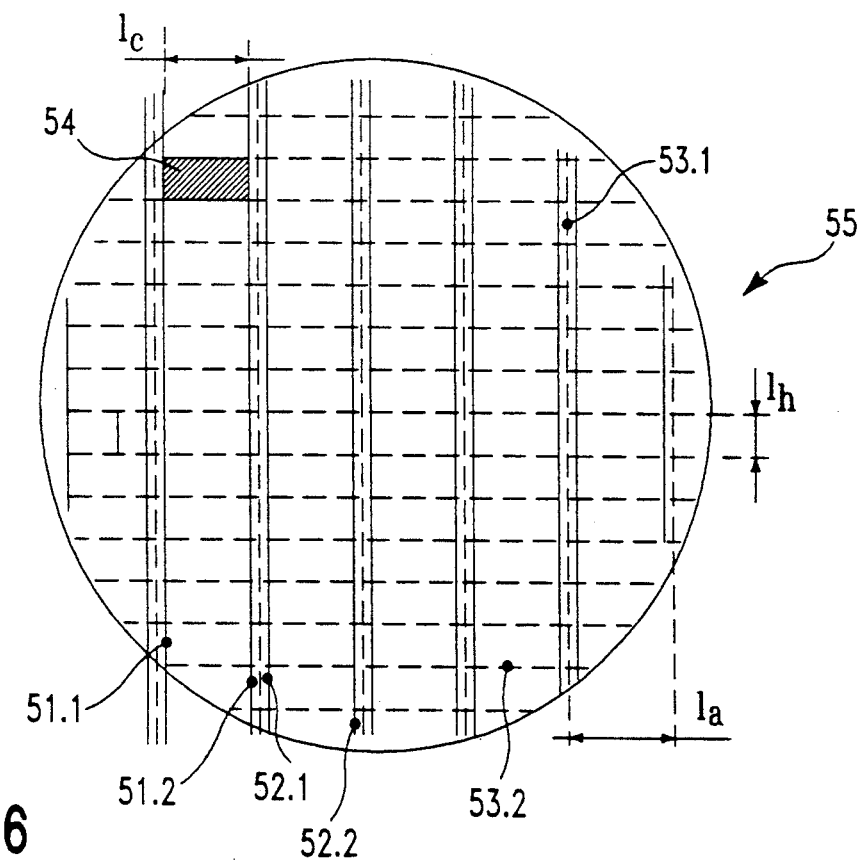
FIG. 6 is the top view of a laser wafer with scribed marks on its upper surface and a partially-cut pattern on its backside.

A typical wafer 55 with scribed marks 51.n (solid lines) on its upper surface and a partially-cut pattern 53.n (dashed lines) on its backside is illustrated in FIG. 6. As can be seen from this Figure, the length $l_c$ of the cavity of a laser 54 is defined by the distance between two parallel scribed marks 51.1 and 51.2. The distance between facets of neighboring lasers is, e.g., determined by marks 51.2 and 52.1. The length $l_a$ and width $l_h$ of a laser chip is demarcated by the rectangular cuts 53.1 and 53.2 of the partially-cut pattern. The partially-cut pattern and the scribed marks are aligned as shown in FIG. 6.

Figure 1D:
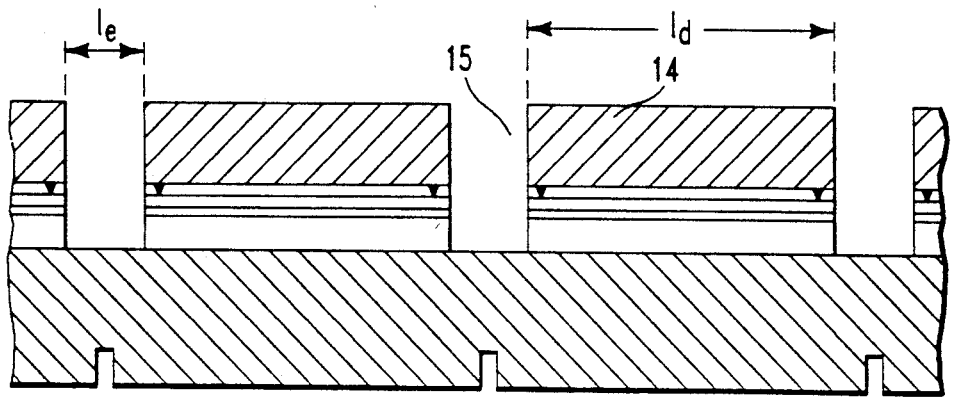
Figure 1E:
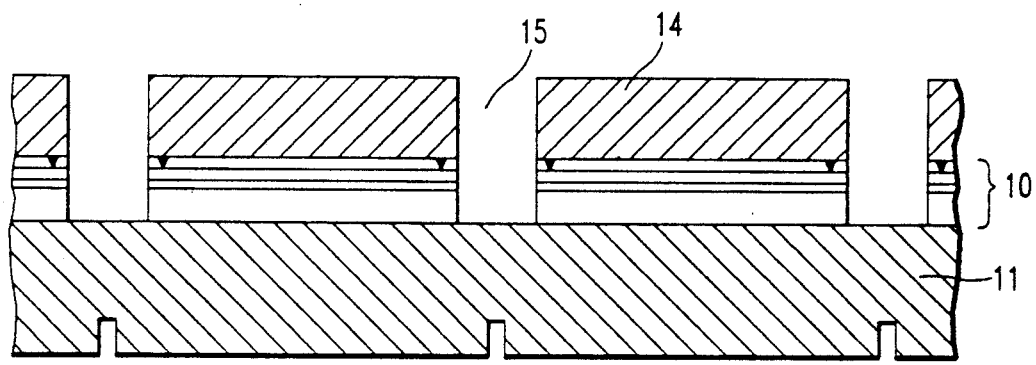
Figure 1F:
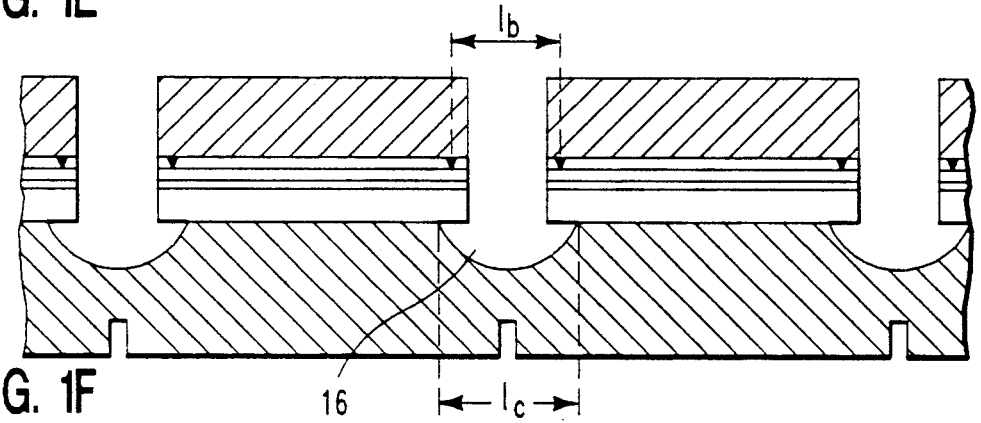
Figure 1G:
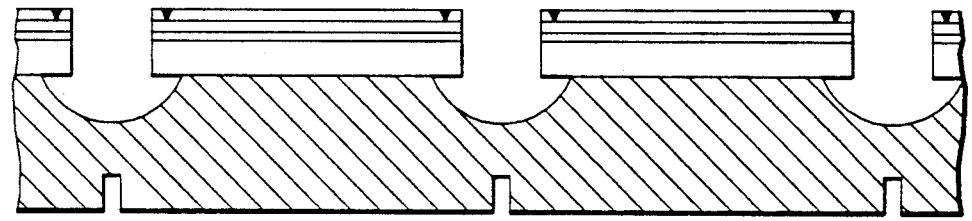
Figure 1H:
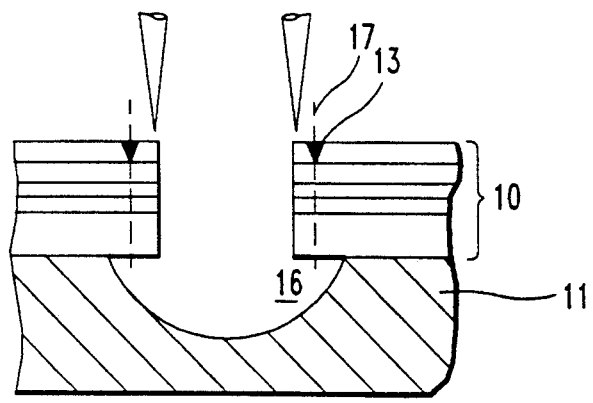
Figure 1I:
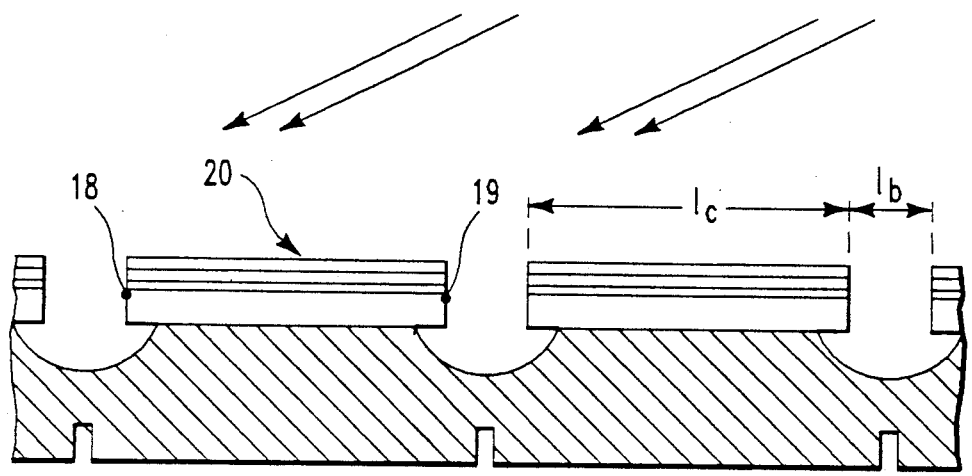
Figure 2:
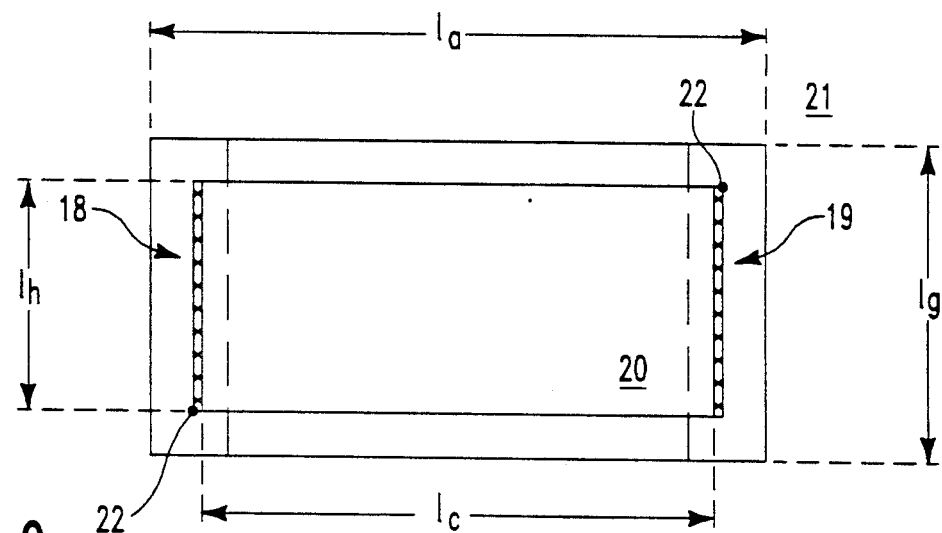
FIG. 2 is a schematic top view of a broad contact laser chip processed as illustrated in FIGS. 1A–1J.

Next, the top surface of the sandwich is covered by a patterned etch mask 14, e.g a photolithographically made mask of photoresist, as shown in FIG. 1D. It consists of rectangular parts which are slightly larger than the size of the lasers to be made. The length $l_d$ of such a rectangular part is greater than that of the cavity $l_c$ such that the mask overlaps the scribed marks 13. The patterned mask 14 is aligned with respect to the scribed marks 13 to ensure that etch windows 15 are placed between the scribed marks 13 defining the position of neighboring facets. The width $l_e$ of these etch windows 15 is smaller than the distance $l_b$ between the scribed marks 13 defining the position of the facets to be cleaved, as illustrated in FIGS. 1C and 1D. After the formation of the patterned etch mask 14, trenches are etched through the laser structure 10. The size and position of these trenches is determined by the etch windows 15, as shown in FIG. 1E. Reactive ion etching (RIE) is preferred to ensure anisotropic etching of the laser structure 10. The carrier substrate 11 is exposed at the bottom of the trenches. Illustratively, GaAs lasers are RIE etched by chlorine.

Next, the laser structure 10 is partly underetched providing for overhanging portions which can be cleaved in one of the following steps. This underetching is carried out using a conventional etchant which isotropically etches the carrier substrate 11. For a carrier substrate of silicon, a suitable etchant is $HNO_3:HF:HC_2H_3O_2$ (45:20:35). The etch time is controlled such that the width $l_f$ of the etch grooves 16 is larger than the distance $l_b$ between neighboring scribed marks 13. Proper underetching of the laser structure 10 is necessary to ensure that cleaving of the laser facets along the scribed marks 13 is possible.

In the following step the etch mask 14 is removed. This can be done by rinsing the whole sandwich in acetone or by performing a resist removal in an ultrasonic bath. As shown in the detailed sketch, FIG. 1H, the overhanging ends of the laser structure 10, can be mechanically cleaved along the scribed marks 13 in a conventional process using needles as schematically indicated. Cleaving takes place along the marks 13, the facets being substantially parallel to the dashed line 17. As can be seen from this sketch, only small portions of the laser structure 10, not the whole overhanging portions, are removed by cleaving the facets. After this full-wafer cleaving, the length $l_c$ of the laser cavities is determined by opposite facets 18 and 19 of a laser 20.

To prevent oxidation of these cleaved facets a mirror passivation layer can be applied such as $Al_2O_3$. The cleaved facets have to be contamination-free before coating them. Two different methods for the coating of the facets are conceivable: 1) providing for a rotational movement of the sandwich and deposition (see FIG. 1I) of the layer; or 2) deposition from both sides, without rotation.

After this step the individual laser diodes are ready. Since they are still situated on top of carrier substrate 11 it is possible to perform full-wafer testing of the lasers.

Figure 1J:
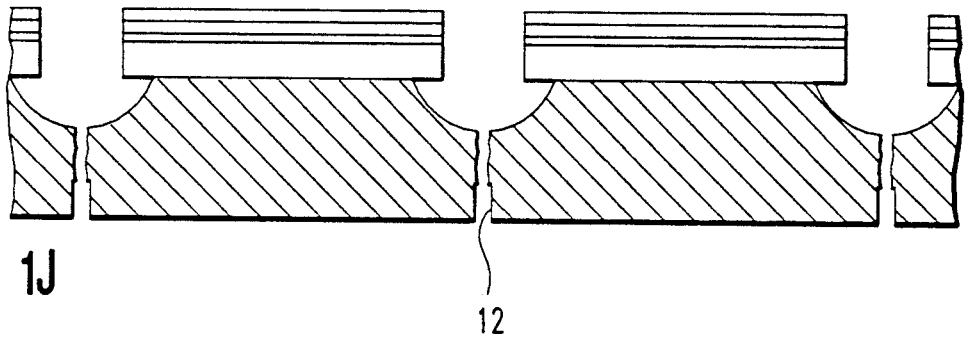

Finally, the laser diodes are separated into laser chips 21, as illustrated in FIG. 1J. This can be done by mechanically cleaving the carrier wafer along the partially-cut pattern 12. Various different method and apparatus are known for cleaving semiconductor chips. Three of these methods are disclosed in:

U.S. Pat. No. 4,044,937, issued Aug. 30, 1977;

European Patent Application, Publication No. 0 363 548;

European Patent Application, Publication No. 0 457 998;

The top view of a laser chip 21, which is made using the above described process, is shown in FIG. 2. The laser diode 20 has a cavity length $l_c$ and a width $l_h$. This diode 20 is mounted on a portion of the carrier substrate 11, the size ($l_a \times l_g$) of this portion being determined by the partially-cut pattern initially cut into the backside of the carrier substrate 11, see FIG. 1B. The facets 18 and 19 of the laser 20 are coated by passivation layers 22, as schematically indicated in FIG. 2.

In the following a second implementation of the method for full-wafer processing of laser diodes with cleaved facets is proposed. This process, as illustrated in FIGS. 3A–3F, is mainly characterized in that it does not require the employment of a carrier substrate. This process begins with a laser structure 30 comprising several epitaxially grown layers 31–33 situated on a substrate 34 formed from the base material of the laser (GaAs in the case of GaAs-based lasers. In this case, layer 32 is an active layer embedded between an upper cladding layer 31 and a lower cladding layer 33. Similar to the first method, a partially-cut pattern 35 determines the size of the laser chips to be made. This partially-cut pattern 35 is scribed into the backside of substrate 34. In a next step illustrated in FIG. 3B, parallel marks 36 are scribed into the uppermost layer 31 of the laser structure 30. By means of these marks 36 the position of the facets to be cleaved is determined as already described in context with FIG. 1C.

Figure 3A:
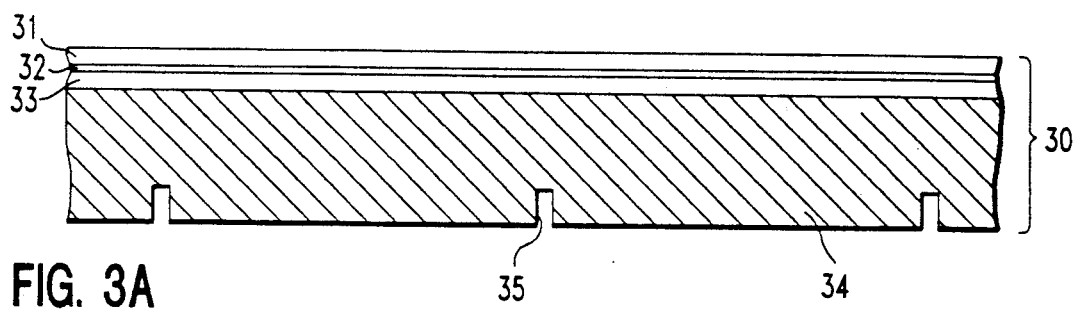
FIGS. 3A–3F are schematic cross-sectional views of processing steps in accordance with the second method.
Figure 3B:
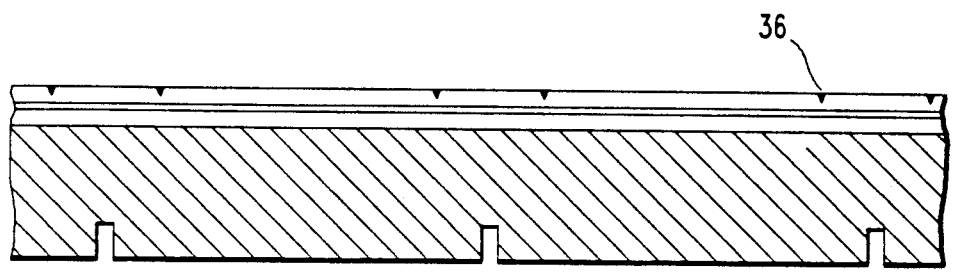
Figure 3C:
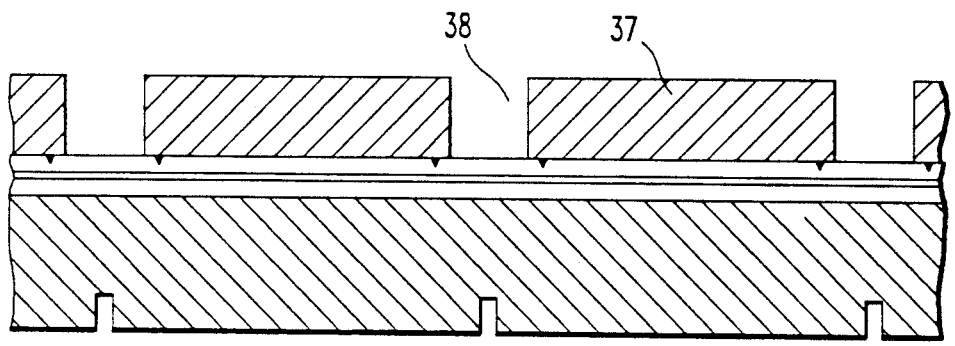
Figure 3D:
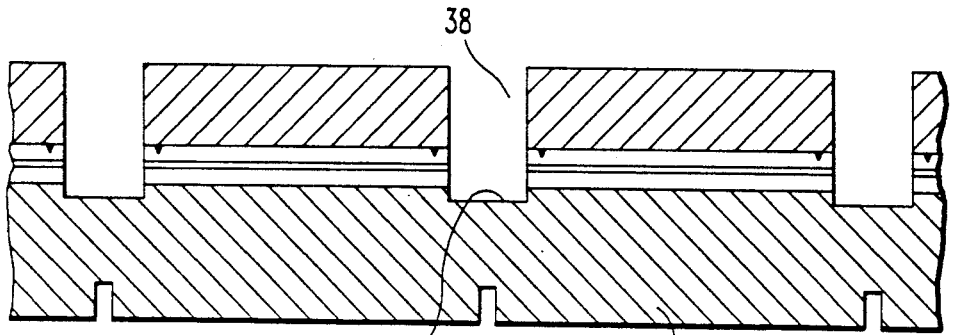

Again, a patterned etch mask 37 having etch windows 38 is deposited on top of the laser structure 30. The etch windows 38 are aligned with respect to the marks 36, as depicted in FIG. 3C.

Figure 3E:
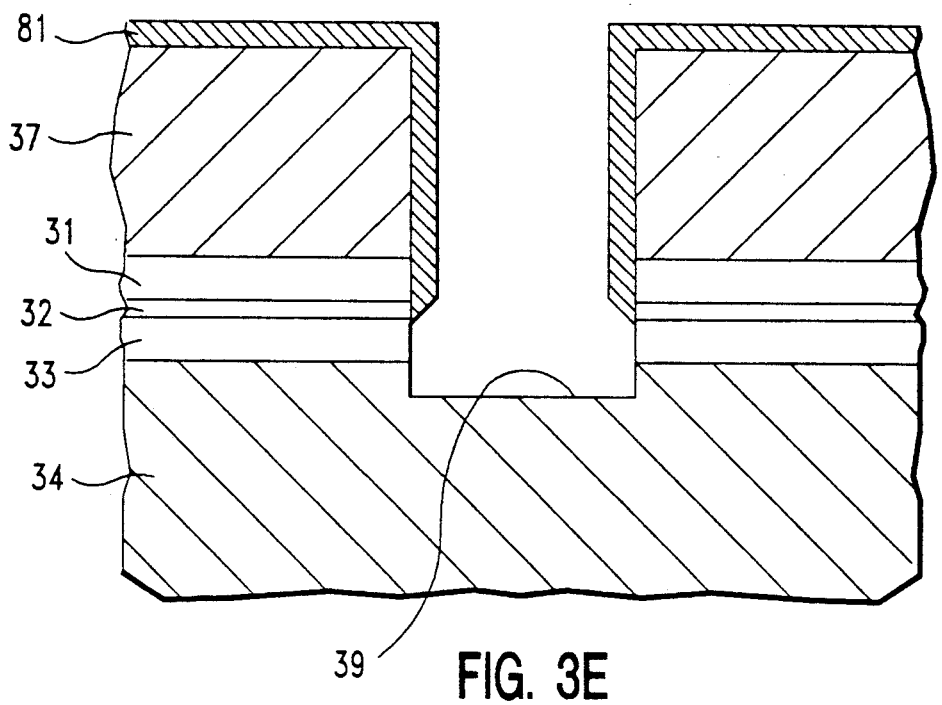
Figure 3F:
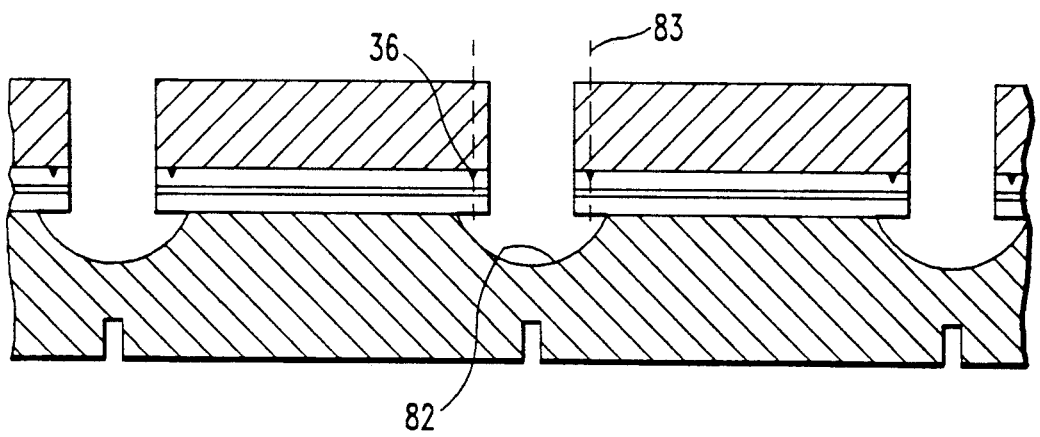

In the follow-up step, trenches are anisotropically etched through an upper portion of the laser structure 30 such that their bottom 39 enters the substrate 34. Before underetching the upper portion of the laser structure 30, the side walls of the trenches can to be protected by an etch-protection layer 81, as schematically illustrated in FIG. 3E. For GaAs, a suitable layer 81 is $SiO_2$. When depositing this optional etch-protection layer 81, it should be ensured that the bottom 39 of the trenches remains uncovered by depositing the etch protection from either side layer/at an angle depending on the trench aspect ratio (width/depth).

Underetching the upper portion, consisting of layers 31–33, without the optional etch-protection layer 81, requires the usage of a highly selective etchant which mainly attacks the GaAs substrate 34 such as $HNO_4OH/H_2O_2$ with Ph in the range 8 to 8.5. Underetching the upper portion, either etch protected or not, provides for overhanging portions which can be cleaved along dashed line 83 and along the scribed marks 36. The width of the etch grooves 82 has to be larger than the distance between neighboring marks 36. The final steps of this process are equal to the steps shown in FIGS. 1I and 1J.

Figure 4:
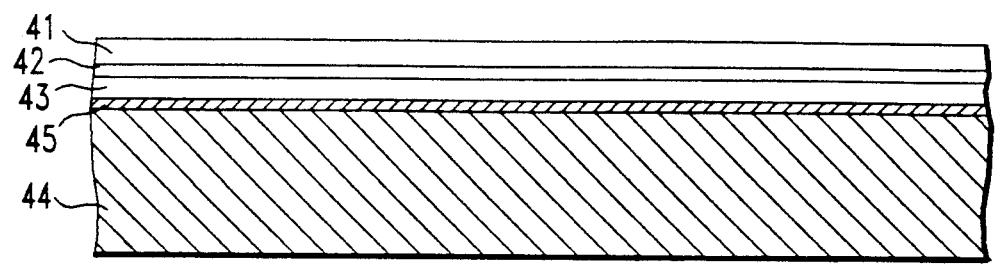
FIG. 4 is a schematic cross-sectional view of a laser structure with an intermediate etch-stop layer in accordance with the third method for processing of laser diodes having cleaved facets.
Figure 5:
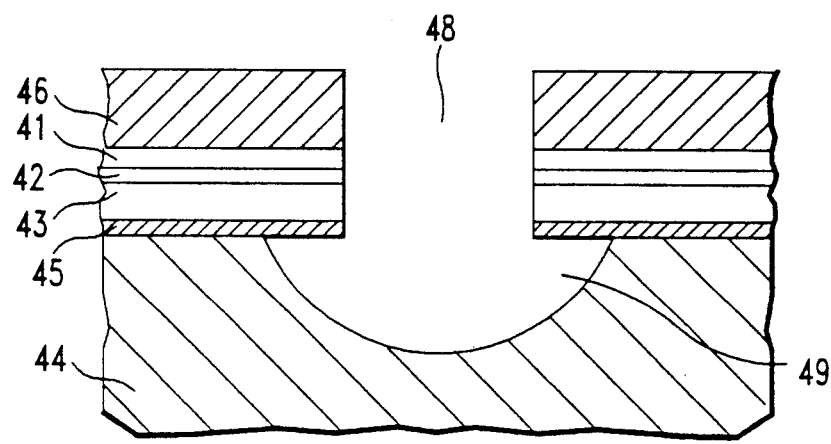
FIG. 5 is a detailed, magnified sketch showing the underetched portion of a structure processed in accordance with the third method.

A modification of the laser structure to be underetched is proposed in context with the third implementation of the invention, illustrated in FIGS. 4 and 5. This modification reduces the damage caused by the etchant during the second etch step. A conventional laser structure comprising epitaxially grown layers is modified by depositing a thin etch-stop layer 45, preferably a layer which provides a basis for further epitaxial growth on top of it. Typical etch-stop layers are reported on in "Selective Dry Etching of AlGaAs-GaAs Heterojunction", K. Hikosaka et al., Japanese Journal of Applied Physics, Vol. 20, No. 11, November 1981, pp. L847–L850, and "An Analytical Study of Etch-Stop Reactions for GaAs on AlGaAs in $CCl_2 F_2$ Plasma", K.L. Seaward et al., Journal of Applied Physics, Vol. 61, No. 6, March 1987, pp. 2358–2364. Preferable are etch-stop layers which do not have a detrimental influence on the performance of the laser.

This etch-stop layer 45, deposited on top of a substrate 44 and covered by epitaxial layers 41–43, is illustrated in FIG. 4. This laser structure 40 is then processed similar to the process shown in FIG. 3A–3D. After etching the trenches, similar to FIG. 3D, the bottoms thereof extending into the substrate 44, the upper portion has to be underetched, as illustrated in FIG. 5. By selection of a suitable etchant as illustrated in the references above, it is ensured that mainly the substrate is attacked. When employing an optional etch-protection layer, as described in context with FIG. 3E, the selection of the etchant used to etch the groove 49 in the substrate 44 is no longer critical, because all parts of the structure 40 which should not be attacked by the etchant are protected. Only the bottoms of the trenches are attacked by the etchant. The trenches 48 of the laser structure 40 are anisotropically etched in a RIE chamber. Grooves 49 can be etched employing HCl or $HCl:H_2O_2:H_2O$, for example.

Figure 7:
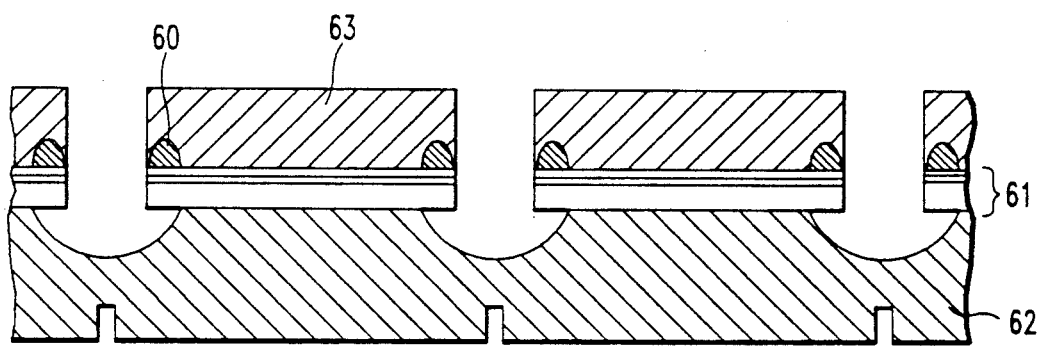
FIG. 7 is a cross-sectional view of a laser structure with thin film studs allowing full-wafer cleaving of the overhanging portions.
Figure 8A:
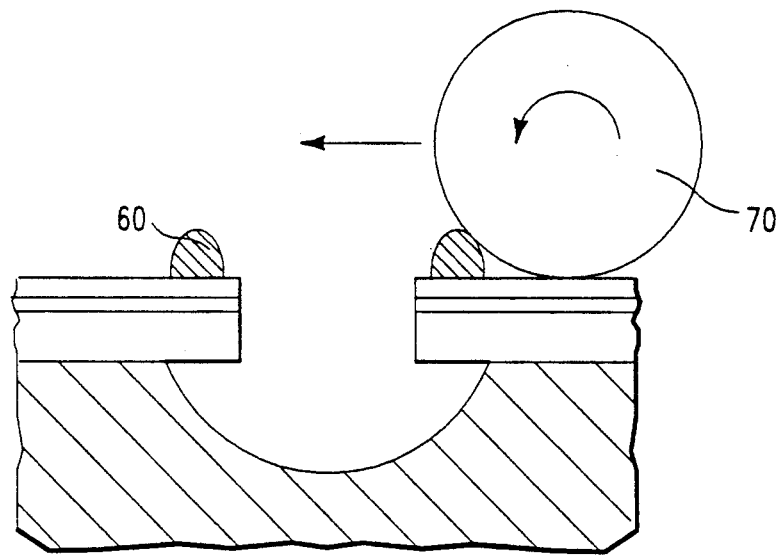
FIGS. 8A, 8B are schematic cross-sectional views of different techniques for mechanical full-wafer cleaving.
Figure 8B:
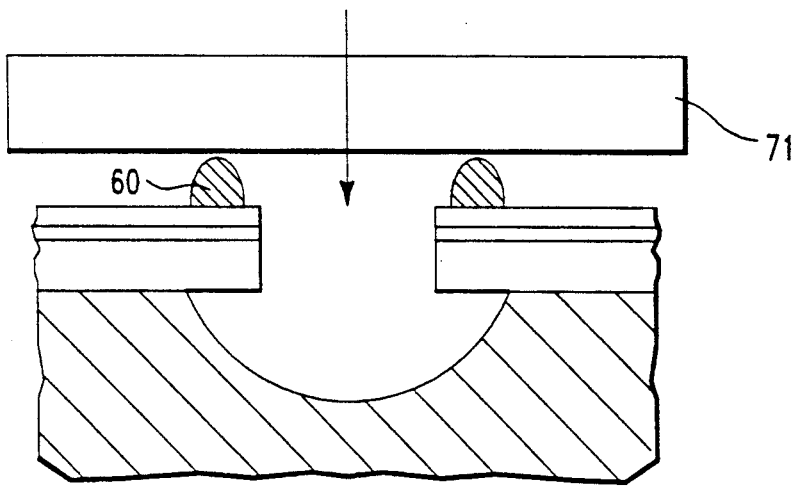

As already mentioned, full-wafer cleaving can be carried out employing thin film studs 60, as schematically shown in FIG. 7. These thin film studs 60 are formed on top of the laser structure 61 by means of standard lithography and deposition techniques before depositing and patterning the etch mask 63. The material used to form these studs 60 should be hard enough to transmit the cleaving force to the overhanging portions of the laser structure 61 such as an Au-Si eutectic. The cleaving takes place on scribe marks close to the studs. As illustrated in FIGS. 8A and 8B, the overhanging portions can be cleaved by applying a cleaving force to these studs 60 using either a roller mechanism 70 or a bar 71 which is pressed onto the studs 60. An additional advantage of such studs is that they can be used as markers for the alignment of the patterned etch mask 63. These two techniques, as well as the 'needle technique' (see FIG. 1H) have the advantage, when compared with ultrasonic cleaving techniques, that all facets are cleaved in one pass. Ultrasonic cleaving requires a control to ensure that vibrations are strong enough to successfully cleave all facets. The energy and the frequency of these vibrations, as known in the art, has to be in a certain relationship to the length of the overhanging portions to achieve kind of a resonance of these overhangs. The length of the overhangs has to be the same over the whole laser structure to allow ultrasonic full-wafer cleaving.

We claim:

1. A method for processing a plurality of semiconductor laser diodes with cleaved facets, starting with a laser structure comprising a plurality of layers formed on top of a laser substrate, comprising the steps of:

a) defining the position of the facets to be cleaved by scribing a set of parallel scribed marks into the top surface of said plurality of layers, said scribed marks being substantially perpendicular to a predetermined optical axis of the lasers to be made, and having a predetermined laser length distance defining the length of a plurality of laser cavities of said laser diodes and a predetermined separation distance between the facets of neighboring laser diodes;

b) covering the uppermost portion of said layers with a protective etch mask that covers each laser diode to be made, extends over said scribed marks defining said laser length of each laser and includes a plurality of etch windows between said scribed marks defining the position of facets of neighboring lasers;

c) etching trenches at least into an upper portion of said laser structure through said plurality of etch windows, thereby leaving a lower portion including said substrate;

d) partly underetching said upper portion during a second etch step of said lower portion through said plurality of etch windows, whereby an undercut portion of a plurality of etch apertures extends under said upper portion past said scribed marks, so that said laser facets can be defined by cleaving said upper portion along said scribed marks without cleaving the whole laser structure;

e) cleaving said underetched upper portions along said scribed marks, thereby defining laser facets perpendicular to said layers and to said optical axis; and f) separating said plurality of laser diodes by cleaving said lower portion between neighboring lasers.

2. The method of claim 1, in which said step of etching said trenches is continued through said laser structure exposing said laser substrate at the bottom of said trenches and said step of undercutting is performed in said laser substrate.

3. The method of claim 2, wherein a partially-cut pattern is cut at the backside of said laser substrate, said pattern consisting of perpendicular cuts defining rectangular sections, one side thereof being longer than said laser length distance and being parallel to the optic axis of the laser diodes, another side being perpendicular to said one side such that said substrate of said laser structure or the carrier substrate can be cleaved along these cuts to separate the individual laser diodes.

4. The method of claim 3, comprising a step of depositing at least one of a passivation, anti-reflection, or protection layer on said cleaved facets before said step of separating said laser diodes and after said step of cleaving said upper portions.

5. The method of claim 2, comprising a step of depositing at least one of a passivation, anti-reflection, or protection layer on said cleaved facets before said step of separating said laser diodes and after said step of cleaving said upper portions.

6. The method of claim 2, wherein the layers of said laser structure are separated from said laser substrate by a thin intermediate etch-stop layer, such that the etchant used for underetching does not attack said upper layers.

7. The method of claim 6, comprising a step of depositing at least one of a passivation, anti-reflection, or protection layer on said cleaved facets before said step of separating said laser diodes and after said step of cleaving said upper portions.

8. The method of claim 7, wherein an etch-protection layer is deposited on the side walls of said trenches prior to underetching.

9. The method of claim 2, wherein the layers of said laser structure are separated from said laser substrate by a thin intermediate etch-stop layer, such that the etchant used for underetching does not attack said upper layers.

10. The method of claim 9, wherein an etch-protection layer is deposited on the side walls of said trenches prior to underetching.

11. The method of claim 10, comprising a step of depositing at least one of a passivation, antireflection, or protection layer on said cleaved facets before said step of separating said laser diodes and after said step of cleaving said upper portions.

12. The method of claim 1, wherein said laser structure is mounted on a carrier substrate differing from said laser substrate and in which said step of etching said trenches is continued through said laser structure exposing said carrier substrate at the bottom of said trenches and said step of undercutting is performed in said carrier substrate.

13. The method of claim 12, wherein a partially-cut pattern is cut at the backside of said laser substrate, said pattern consisting of perpendicular cuts defining rectangular sections, one side thereof being longer than said laser length distance and being parallel to the optic axis of the laser diodes, another side being perpendicular to the said one side such that said substrate of said laser structure or the carrier substrate can be cleaved along these cuts to separate the individual laser diodes.

14. The method of claim 13, comprising a step of depositing at least one of a passivation, antireflection, or protection layer on said cleaved facets before said step of separating said laser diodes and after said step of cleaving said upper portions.

15. The method of claim 12, comprising a step of depositing at least one of a passivation, antireflection, or protection layer on said cleaved facets before said step of separating said laser diodes and after said step of cleaving said upper portions.

16. The method of claim 12, wherein the layers of said laser structure are separated from said laser substrate by a thin intermediate etch-stop layer, such that the etchant used for underetching does not attack said upper layers.

17. The method of claim 16, comprising a step of depositing at least one of a passivation, antireflection, or protection layer on said cleaved facets before said step of separating said laser diodes and after said step of cleaving said upper portions.

18. The method of claim 17, wherein an etch-protection layer is deposited on the side walls of said trenches prior to underetching.

19. The method of claim 12, wherein the layers of said laser structure are separated from said laser substrate by a thin intermediate etch-stop layer, such that the etchant used for underetching does not attack said upper layers.

20. The method of claim 19, wherein an etch-protection layer is deposited on the side walls of said trenches prior to underetching.

21. The method of claim 20, comprising a step of depositing at least one of a passivation, antireflection, or protection layer on said cleaved facets before said step of separating said laser diodes and after said step of cleaving said upper portions.